(12) United States Patent  
Jogan et al.

(10) Patent No.: US 6,686,052 B2
(45) Date of Patent: Feb. 3, 2004

(54) COOLING PLATE AND PRODUCTION METHOD THEREFOR

(75) Inventors: Shigetoshi Jogan, Kishiwada (JP); Kiyoshi Tada, Neyagawa (JP)

(73) Assignee: Showa Denko, K.K., Tokyo (JP)

( * ) Notice: Subject to any disclaimer, the term of this patent is extended or adjusted under 35 U.S.C. 154(b) by 0 days.

(21) Appl. No.: 10/175,000

(22) Filed: Jun. 20, 2002

(65) Prior Publication Data

US 2003/0022008 A1 Jan. 30, 2003

Related U.S. Application Data

(60) Provisional application No. 60/330,927, filed on Nov. 2, 2001.

(51) Int. Cl.[7] .......................... B32B 15/04; B32B 15/08; B32B 15/20; F28F 1/00; F16J 15/00
(52) U.S. Cl. .................. 428/472.2; 428/457; 428/304.4; 428/166; 428/188; 428/701; 428/626; 428/418; 428/461; 165/170; 277/642
(58) Field of Search .................. 165/170; 277/641, 277/642; 428/472.2, 626, 472.1, 33, 469, 461, 418, 506, 701, 702, 699, 629, 632, 650, 166, 188, 167, 320.2, 934, 304.4, 457, 477.4

(56) References Cited

U.S. PATENT DOCUMENTS 6,344,117 B2 * 2/2002 Enomoto et al. ...... 204/298.09
2002/0153130 A1 * 10/2002 Okamoto et al. ........... 165/170

FOREIGN PATENT DOCUMENTS

| JP | 1-16225 | 3/1989 |
| JP | 2000-73164 | 3/2000 |
| JP | 2000-248399 | 9/2000 |
| JP | 2000-311932 | * 11/2000 |

* cited by examiner

Primary Examiner—Michael LaVilla
(74) Attorney, Agent, or Firm—Oblon, Spivak, McClelland, Maier & Neustadt, P.C.

(57) ABSTRACT

A cooling plate provided with a cooling medium passage therein is formed by integrally joining a plurality of metal plates each having a cooling medium passage forming groove on a joining surface thereof. An anodic oxide film is formed on at least the cooling medium passage forming groove on the joining surface, and the plurality of metal plates are integrally joined each other by a friction agitation joining method. This enhances corrosion resistance of the cooling medium passage, resulting in an improved durability and extended life, which enables uniform cooling performance.

10 Claims, 4 Drawing Sheets

COOLING PLATE AND PRODUCTION METHOD THEREFOR

This application claims priority to Japanese Patent Application No. 2001-185859 filed on Jun. 20, 2001 and U.S. Provisional Patent Application No. 60/330,927 filed on Nov. 2, 2001, the disclosure of which is incorporated by reference in its entirety.

CROSS REFERENCE TO RELATED APPLICATIONS

This application is an application filed under 35 U.S.C. §111(a) claiming the benefit pursuant to 35 U.S.C. §119(e)(1) of the filing date of Provisional Application No. 60/330,927 filed on Nov. 2, 2001 pursuant to 35 U.S.C. §111(b).

BACKGROUND OF THE INVENTION

1. Field of the Invention

The present invention relates to a cooling plate used for, for example, various temperature controlling cooling plates such as backing plates, susceptors for use in sputtering apparatuses, semiconductor manufacturing apparatuses or LCD manufacturing apparatuses.

In this specification, the language "aluminum" denotes aluminum and its alloys.

2. Description of Related Art

For example, a sputtering apparatus for manufacturing semiconductors has a backing plate for holding a target. As shown in FIG. 6, the backing plate 101 is provided with a cooling medium passage 102 therein for cooling the target 100 attached to the surface of the backing plate. In detail, the backing plate 101 is comprised of two aluminum plates 103 and 104 joined in a stacked manner, and provided with a circuit-like cooling medium passage 102 therein formed by integrally joining aluminum plates 103 and 104 so as to coincide with cooling medium passage forming grooves each formed on the joining surface of the aluminum plate.

In a conventional baking plate, the joining of the two aluminum plates 103 and 104 is generally performed by brazing the joining surfaces to prevent the leakage of the cooling medium passing through the cooling medium passage 102.

However, in a conventional backing plate, since the aluminum surfaces of the grooves 105 and 106 are exposed as it is, these grooves corrode when water, etc., as a cooling medium passes through these grooves 105 and 106 for a certain time period. Thus, the life as a backing plate is relatively short. Because of the degradation by the corrosion, the backing plate should be replaced with new one within, e.g., one or two years.

SUMMARY OF THE INVENTION

The present invention is made in view of the aforementioned technical background, and aims to provide a high cooling performance cooling plate with a cooling medium passage which is excellent in corrosion resistance and long in life.

The aforementioned object can be attained by a cooling plate provided with a cooling medium passage therein, the cooling medium passage being formed by integrally joining a plurality of metal plates each having a cooling medium passage forming groove on a joining surface thereof, characterized in that: an anodic oxide film is formed on at least the cooling medium passage forming groove on the joining surface, and the plurality of metal plates are integrally joined each other by a friction agitation joining method.

With this cooling plate, since the anodic oxide film covers at least the cooling medium passage forming groove, the corrosion of the cooling medium passage can be effectively prevented, which dramatically enhances the durability of the cooling plate. Furthermore, since the joining of the metal plates is performed by a friction agitation joining method, the welded portion does not give bad influence such as degradation on the anodic oxide film. Accordingly, the excellent corrosion-prevention effect can be maintained effectively, resulting in a cooling plate excellent in durability and long in life. Furthermore, due to the friction agitation joining method, the metal plates can be joined in a good condition, which enables a uniform cooling.

It is preferable that the anodic oxide film is formed on an entire surface of the joining surface of the metal plate. This enables a corrosion prevention of not only the cooling medium passage but also the entire joined surfaces of the metal plates, which further improves the durability of the cooling plate.

It is preferable that at least the vicinity of the peripheral portion of the cooling medium passage in a gap between joined metal plates is fluid-tightly sealed with a sealing agent. This prevents the leaking of cooling medium such as water to portions other than the cooling medium passage and the stagnation of the cooling medium. Thus, the generation of corrosion at gaps can be prevented assuredly, which further improves the durability of the cooling plate.

From a viewpoint of joint durability, it is preferable that the sealing agent is metal material, or the sealing agent is waterproof resin adhesive.

It is preferable that the waterproof resin adhesive is one or more resin selected from a group consisting of epoxy family resin, phenol family resin and polyolefin family resin because these resin are excellent especially in joint durability.

An aluminum plate is preferably used as the metal plate. This results in a lightweight cooling plate.

According to a method for manufacturing a cooling plate of the present invention, the method includes: a first step for forming a cooling medium passage forming groove on each joining surface of a plurality of metal plates; a second step for forming an anodic oxide film by anodizing joining surfaces of the metal plates; and a third step for integrally joining the plurality of metal plates with the plurality of metal plates stacked by a friction agitation joining method. With this method, it is possible to effectively manufacture a cooling plate having the aforementioned features according to the present invention. Furthermore, since the anodizing processing is executed before the friction agitation joining, the anodic oxide film can be formed even at the details of the joining surfaces of the metal plates. Thus, the reliability of corrosion prevention at the joining surfaces of the metal plates can be enhanced, which enables to manufacture a high-performance cooling plate. Furthermore, since the joining of metal plates is performed by a friction agitation joining, the metal plates can be joined without deteriorating the previously formed anodic oxide film during the joining. Therefore, the aforementioned excellent corrosion resisting effects can be maintained sufficiently, which enables to manufacture a cooling plate excellent in durability and long in life.

Other objects and the features will be apparent from the following detailed description of the present invention with reference to the attached drawings.

DETAILED DESCRIPTION OF THE PREFERRED EMBODIMENTS

Figure 1:
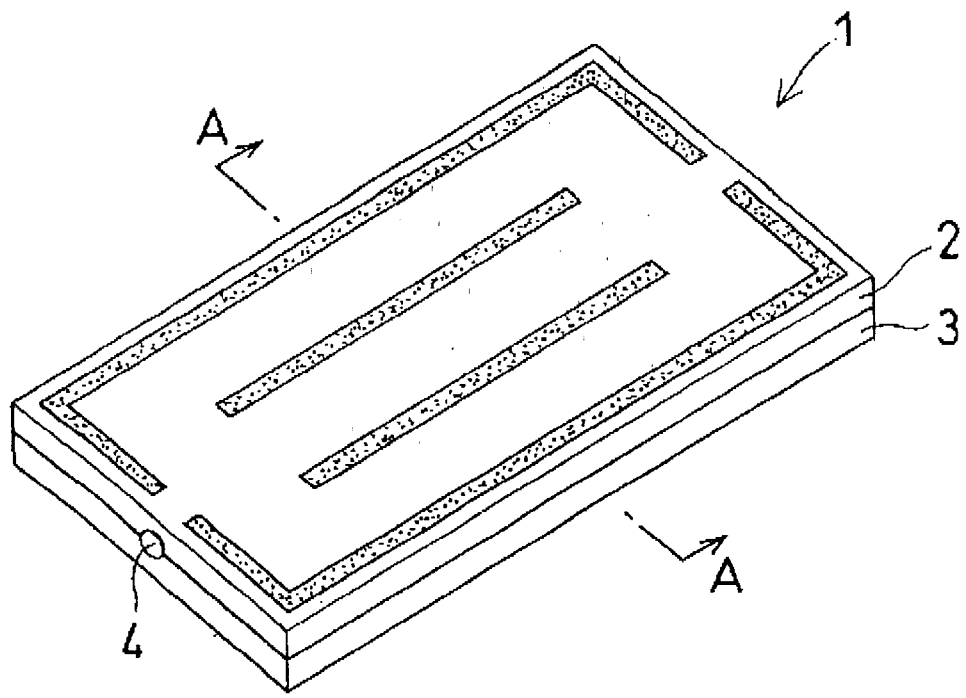
FIG. 1 is a perspective view showing a cooling plate according to an embodiment of the present invention.
Figure 2:
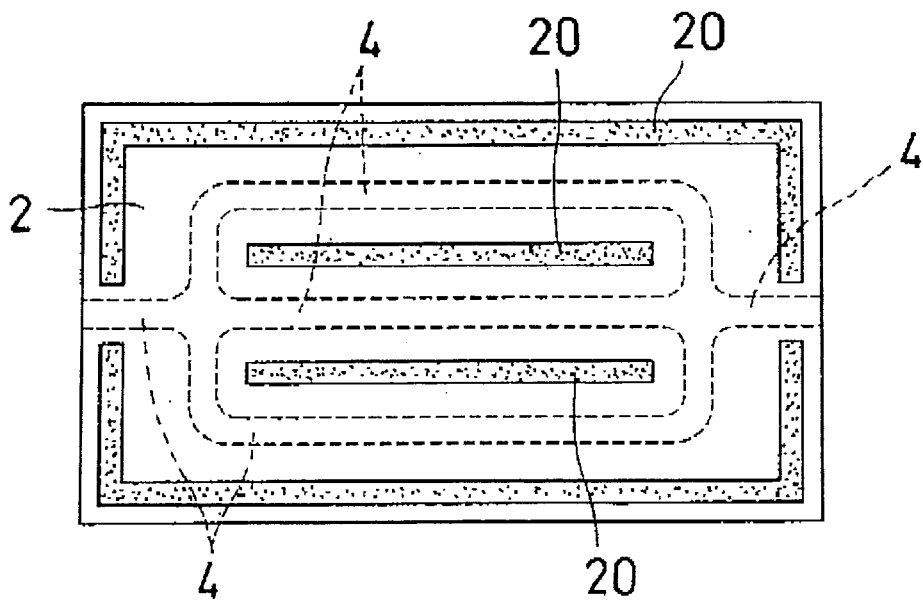
FIG. 2 is a plan view of the cooling plate.

A cooling plate according to an embodiment of the present invention is shown in FIGS. 1 to 3. This cooling plate 1 is a plate used as a backing plate for a sputtering apparatus, and is a clad plate comprised of two metal plates 2 and 3 stacked and integrally joined. In this embodiment, an aluminum plate is used as the metal plate 2 and 3.

Figure 3A:
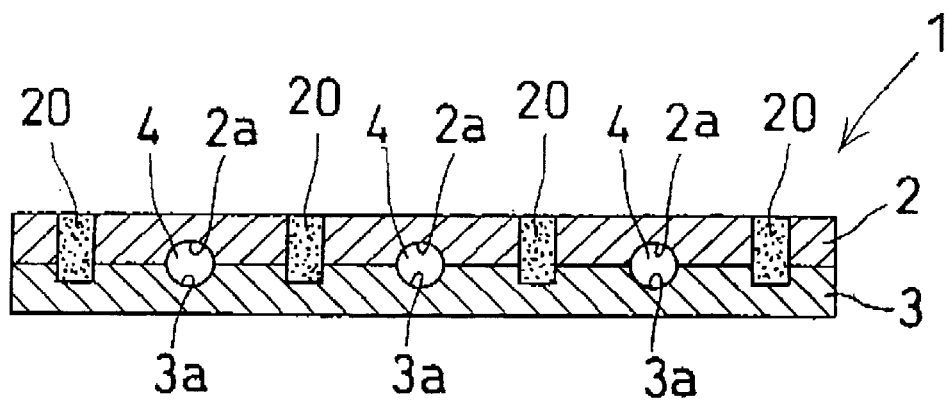
FIG. 3A is a cross-sectional view taken along the line A—A in FIG. 1.
Figure 4:
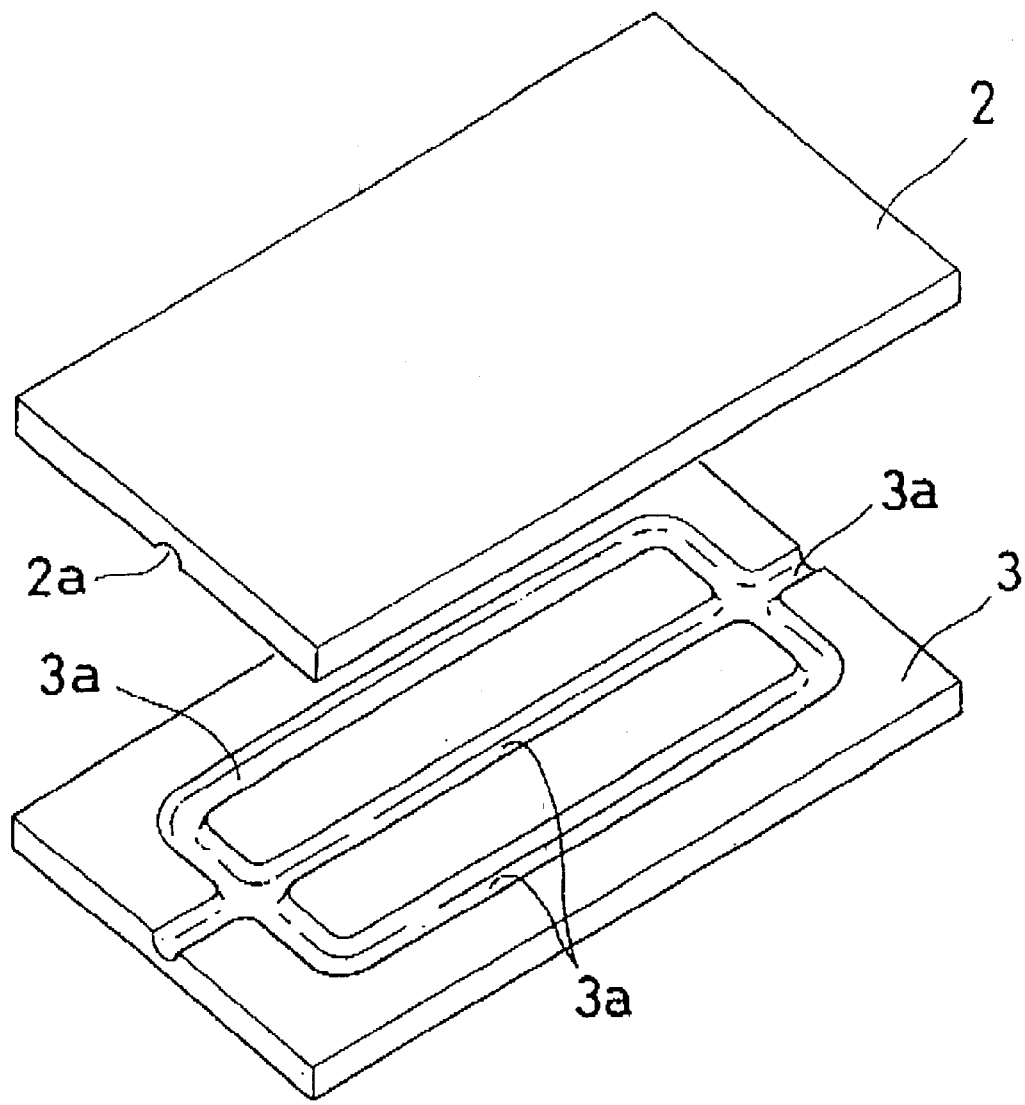
FIG. 4 is an explored perspective view of the cooling plate before joining.

On each joining surface of the aforementioned two metal plates 2 and 3, a cooling medium passage forming groove 2a and 3a having a semicircular cross-sectional shape is formed. That is, as shown in FIG. 4, on the joining surface of the lower metal plate 3, a cooling medium passage forming groove 3a is formed such that one groove formed at one longitudinal end branches in the three directions, and these three grooves extends in parallel along the longitudinal direction and then these three grooves join at the other end. The upper metal plate 2 is also provided with exactly the same cooling medium passage forming groove 2a as that of the lower metal plate. As shown in FIG. 3A, the metal plates 2 and 3 are stacked and integrally joined in a manner that the grooves 2a and 3a coincide with each other, thereby forming a circuit-like coolant medium passage 4 in the cooling plate 1 (see FIG. 2).

Figure 3B:
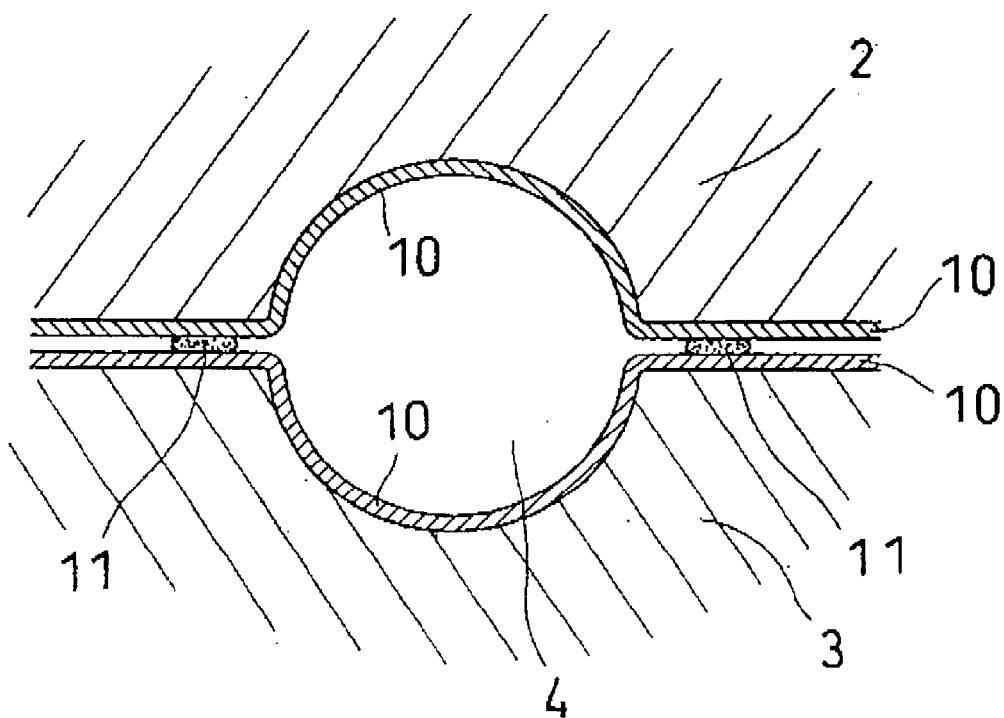
FIG. 3B is an enlarged cross-sectional view showing the cooling medium passage and its vicinity shown in FIG. 3A.

As enlarged and shown in FIG. 3B, on each of the joining surfaces of the two metal plates 2 and 3, an anodic oxide film 10 is formed. In detail, the cooling medium passage forming grooves 2a and 3a are covered with an anodic oxide film 10 and 10, respectively, and the remaining entire area of the joining surfaces of the metal plates 2 and 3 is also covered with an anodic oxide film 10 and 10. Since the anodic oxide film is formed on the cooling medium passage forming grooves 2a and 3a, the corrosion of the cooling medium passage 4 can be prevented effectively, and thus the durability as a cooling plate 1 can be effectively improved. Furthermore, since the anodic oxide film is formed on the entire joining surfaces of the metal plates 2 and 3 including the cooling medium passage forming grooves 2a and 3a, not only the corrosion prevention of the cooling medium passage 4 but also that of the entire joining surfaces can be attained, which further improves the durability of the cooling plate 1.

Furthermore, as shown in FIG. 3B, the vicinity of the peripheral portion of the cooling medium passage 4 in a gap between the joining surfaces of the metal plates 2 and 3 is liquid-tightly sealed by a sealing agent. Generally, in cases where a gap is formed between the joining surfaces of the metal plates, gap corrosion easily generates due to the cooling medium such as water. However, when at least the vicinity of the peripheral portion of the cooling medium passage 4 in the aforementioned gap is sealed with a sealing agent, the leaking of cooling medium such as water to portions other than the cooling medium passage and the stagnation of the cooling medium are prevented. Thus, the generation of corrosion at gaps can be prevented assuredly, which further improves the durability of the cooling plate. The entire gap between the joining surfaces of the metal plates may be sealed with a sealing agent.

The joining of the two metal plates 2 and 3 is performed by a friction agitation joining method. This friction agitation joining method is performed as follows: a rotating prove is inserted into a portion to be welded; and then advanced with the rotating prove inserted therein along the portion while softening by heat caused by the friction and agitating the soften portion to which the probe contacts. Since the friction agitation joining method is one of solid-state-welding methods, it is possible to join different metals. In this embodiment, as shown in FIGS. 1, 2 and 3A, the friction agitation joining is performed from the upper surface side of the metal plate 2, and the welded portions 20 are positioned at the central portions surrounded by the peripheral portion of the metal plates 2 and 3 and three parallel grooves 2a, 2a and 2a.

Since the joining of two metal plates 2 and 3 is performed by a friction agitation joining method, the welded portions 20 will never give bad influence such as degradation to the anodic oxide film 10 after the manufacture. Accordingly, enough excellent corrosion prevention effect can be maintained, resulting in a cooling plate 1 excellent in durability and long in life. Furthermore, since the joining is performed by a friction agitation joining method, the two metal plates 2 and 3 can be joined in a good shape even if the anodic oxide films exist, which in turn enables uniform cooling as a cooling plate 1.

In this invention, as the sealing agent 11, any agent capable of fluid-tightly sealing the gap between the joining surfaces of the metal plates 2 and 3 can be used. Among others, a sealing agent made of metal materials (metal fitting) or a sealing agent made of waterproof resin adhesives may be preferably used since they can improve the joining (adhesive) durability.

Although the metal material constituting the sealing agent 11 is not limited to a specific one, aluminum can be exemplified.

As for the waterproof resin adhesive constituting the sealing agent 11, although it is not limited to a specific one, it is preferable to use adhesive constituted by one or more resins selected from a group consisting of epoxy family resin, phenol family resin and polyolefin family resin.

For example, the cooling plate 1 according to the present invention is manufactured as follows. First, on each joining surface of two metal plates 2 and 3, a cooling medium passage forming groove 2a and 3a is formed by pressing the joining surface with a forming press having a forming protrusion corresponding to the groove 2a and 3a (first step).

Next, each of the joining surfaces of the metal plates 2 and 3 is anodized to form an anodic oxide film (second step).

Subsequently, the metal plates are stacked so as to fit the joining surfaces in a manner such that the cooling medium passage forming grooves 2a and 3a coincide each other, and the thus stacked metal plates 2 and 3 are integrally joined by a friction agitation joining method (third step).

According to this manufacturing method, since the anodizing processing is performed before the friction agitation joining, anodic oxide film can be formed in a good shape on the details of the joining surfaces of the metal plates 2 and 3. Therefore, the reliability of corrosion prevention at the joining surfaces of the metal plates 2 and 3 can be enhanced. As a joining method after forming the anodic oxide films, since a friction agitation joining method is employed, there is an advantage that the joining does not deteriorate the previously formed anodic oxide film.

In the aforementioned embodiment, although the anodic oxide film 10 is formed on the joining surfaces of the metal plates 2 and 3, the film may also be formed on the external surfaces (surfaces opposite to the joining surfaces).

Furthermore, in the aforementioned embodiment, although two metal plates 2 and 3 are stacked and joined to form a two-plates-structure, one or more plates may be combined with the two-plates-structure as a fundamental structure in a manner similar to the above, which is also covered by the present invention.

In the aforementioned embodiment, although the cross-sectional configuration of the cooling medium passage 4 is a circle, the cross-sectional configuration is not necessary limited to it. Furthermore, the circuit configuration of the cooling medium passage 4 is not limited to the branch-and-join type mentioned in the aforementioned embodiment and may be, for example, a serpentine type circuit.

Figure 5:
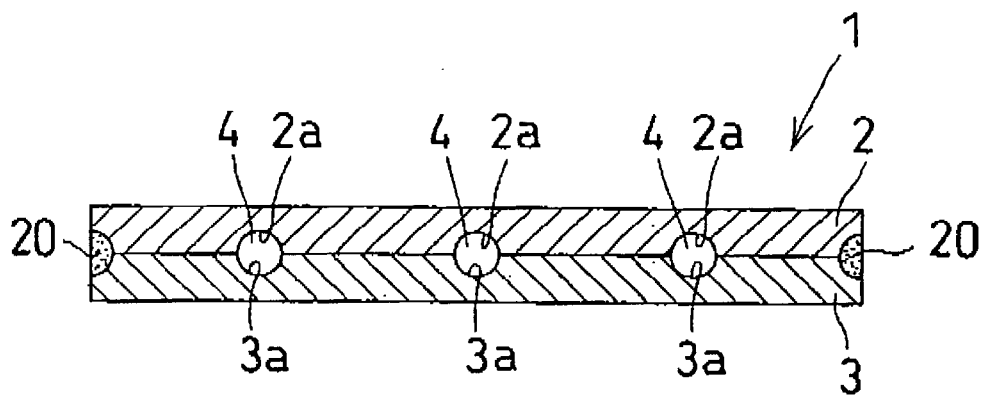
FIG. 5 is a cross-sectional view showing a cooling plate according to another embodiment.
Figure 6:
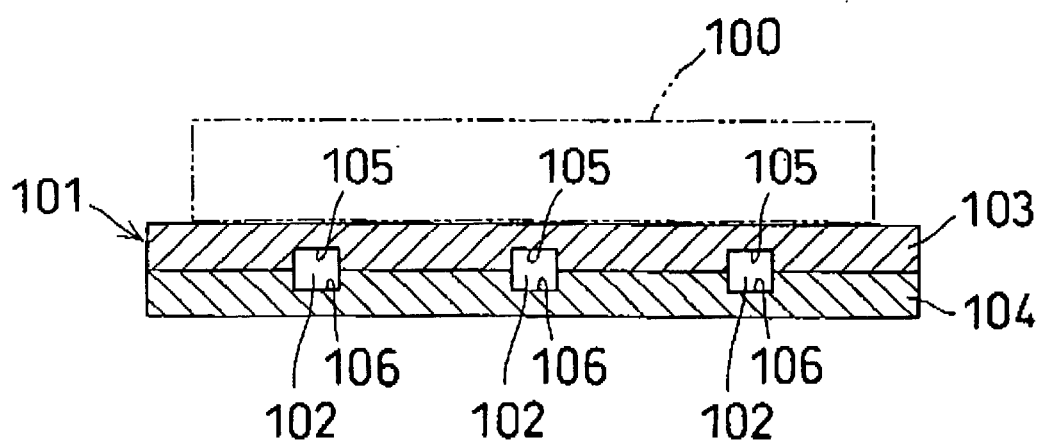
FIG. 6 is a cross-sectional view showing a conventional cooling plate.

In the aforementioned embodiment, although the friction agitation joining is performed from the upper surface side of the metal plate 2, the joining may be performed from, for example, the side surface of the metal plates 2 and 3 as shown in FIG. 5.

Furthermore, in the aforementioned embodiment, although the cooling plate is exemplified as a backing plate for a sputtering apparatus, the application of the cooling plate according to the present invention is not limited to the above. The cooling plate can be used as a backing plate or a susceptor for semiconductor manufacturing apparatuses or LCD manufacturing apparatuses, or various temperature controlling cooling plate.

Next, concrete embodiments of the present invention will be explained.

EXAMPLE 1

Two aluminum plates each having grooves shown in FIG. 4 were prepared. Anodizing according to a sulfuric acid method (anodized for 15 minutes by alternating current electrolysis of current density of 1.3 $A/dm^2$, boiling-water sealing) was executed on the groove-forming surface (joining surface) of each aluminum plate to thereby form an anodic oxide film of 6 $\mu$m thickness.

The groove forming surfaces of the aluminum plates were fitted each other such that the position of the groove coincided, and then in this state a friction agitation joining was performed to integrally join the aluminum plates, thereby obtaining a cooling plate.

EXAMPLE 2

A cooling plate was obtained in the same manner as Example 1 except that the vicinity of the periphery of the cooling medium passage in a gap between the joining surfaces (anodic oxide films) of the aluminum plates was liquid-tightly sealed with a sealing agent made of aluminum.

EXAMPLE 3

A cooling plate was obtained in the same manner as Example 1 except that the vicinity of the periphery of the cooling medium passage in a gap between the joining surfaces (anodic oxide films) of the aluminum plates was liquid-tightly sealed with a sealing agent made of epoxy family resin adhesive.

EXAMPLE 4

A cooling plate was obtained in the same manner as Example 1 except that the vicinity of the periphery of the cooling medium passage in a gap between the joining surfaces (anodic oxide films) of the aluminum plates was liquid-tightly sealed with a sealing agent made of phenol family resin adhesive.

EXAMPLE 5

A cooling plate was obtained in the same manner as Example 1 except that the vicinity of the periphery of the cooling medium passage in a gap between the joining surfaces (anodic oxide films) of the aluminum plates was liquid-tightly sealed with a sealing agent made of polyolefin family resin adhesive.

EXAMPLE 6

A cooling plate was obtained in the same manner as Example 1 except that the vicinity of the periphery of the cooling medium passage in a gap between the joining surfaces (anodic oxide films) of the aluminum plates was liquid-tightly sealed with a sealing agent made of acrylic family resin adhesive.

Comparative Example 1

A cooling plate was obtained in the same manner as Example 1 except that an anodic oxide film was not formed.

Comparative Example 2

A cooling plate was obtained in the same manner as Example 1 except that TIG welding was employed instead of the friction agitation joining.

Corrosion resistance (corrosion-prevention nature) of each obtained cooling plate was evaluated by the following testing method.

Corrosion Resistance (Corrosion-Prevention Nature) Testing Method

The below-mentioned corrosion test liquid (aqueous solution) was passed through each cooling medium passage for 500 hours under the conditions of the flow rate of 30 L/minute and the liquid temperature of 90 to 95° C. Thereafter, the cooling medium passage and the gap between the joining surfaces were observed and evaluated as: "O" when no corrosion was generated; "△" when corrosion was slightly generated; and "✕" when corrosion was greatly generated. In Table 1, the evaluation "△-O" means that no corrosion was basically generated but slight corrosion was occasionally generated. To the contrary, the evaluation "✕" means that the generation of corrosion was restrained assuredly.

Corrosion test liquid (NaCl: 234 mg/L, $Na_2SO_4$:89 mg/L, $CuCl_2.2H_2O$: 2.7 mg/L, $FeCl_2.6H_2O$: 145 mg/L)

TABLE 1

| | Joining method | Sealing (Type) | Anodic oxide film | Cooling medium passage | Corrosion resistance Joining gap* |
|---|---|---|---|---|---|
| Example 1 | Friction Agitation Joining | No | Yes (6 μm) | ◯ | Δ |
| Example 2 | Friction Agitation Joining | Yes (Al) | Yes (6 μm) | ◯ | ◯ |
| Example 3 | Friction Agitation Joining | Yes (epoxy family resin) | Yes (6 μm) | ◯ | ◯ |
| Example 4 | Friction Agitation Joining | Yes (phenol family resin) | Yes (6 μm) | ◯ | ◯ |
| Example 5 | Friction Agitation Joining | Yes (polyolefin family resin) | Yes (6 μm) | ◯ | ◯ |
| Example 6 | Friction Agitation Joining | Yes (acrylic family resin) | Yes (6 μm) | ◯ | Δ14 ◯ |
| Comparative Example 1 | Friction Agitation Joining | No | No | X | Δ |
| Comparative Example 2 | TIG welding | No | No | X | X |

Note:
*Joining gap means a gap between joining surfaces

As shown in FIG. 1, the cooling plates of Examples 1 to 6 were excellent in corrosion resistance at both the cooling medium passage and the joining gap. Especially, in Examples 2 to 6 in which the gap between the joining surfaces was sealed with a sealing agent, no corrosion was generated and the cooling plate was extremely excellent in corrosion resistance. To the contrary, the cooling plates of Comparative Examples 1 and 2 were inferior in corrosion resistance.

As mentioned above, in the cooling plate according to the present invention, since an anodic oxide film covers at least a cooling medium passage forming groove, the corrosion of the cooling medium passage can be effectively prevented, which dramatically enhances the durability of the cooling plate. Furthermore, since the joining of the metal plates is performed by a friction agitation joining method, the welded portion does not give bad influence such as degradation on the anodic oxide film. Accordingly, the excellent corrosion-prevention effect can be maintained for a long time period, resulting in a cooling plate excellent in durability and long in life due to these synergistic effects. Furthermore, due to the friction agitation joining method, the metal plates can be joined in a preferable manner, which enables a uniform cooling over the entire surface.

In cases where the anodic oxide film is formed on the entire area of the joining surfaces of the metal plates, the durability of the cooling plate can be further enhanced.

In cases where at least a vicinity of the peripheral portion of the cooling medium passage in a gap between joined metal plates is fluid-tightly sealed with a sealing agent, the generation of the gap corrosion can be prevented assuredly, resulting in a further enhanced durability of the cooling plate.

In cases where the sealing agent is metal material or waterproof resin adhesive, the joint durability can be further enhanced, which in turn can improve the sealing reliability.

In cases where the waterproof resin adhesive is one or more resin selected from a group consisting of epoxy family resin, phenol family resin and polyolefin family resin, the adhesive durability can be effectively improved, resulting in a long-term sealing, which in turn further improves the durability of the cooling plate.

In cases where the metal plate is an aluminum plate, the cooling plate becomes excellent in lightweight.

Furthermore, according to the method for manufacturing a cooling plate of the present invention, it is possible to effectively manufacture a cooling plate. Furthermore, since the anodizing processing is executed before the friction agitation joining, the anodic oxide film can be formed even at the details of the joining surfaces of the metal plates. Thus, the reliability of corrosion prevention at the joining surfaces of the metal plates can be enhanced, which enables to manufacture a high-performance cooling plate. Furthermore, since the joining of metal plates is performed by a friction agitation joining, the metal plates can be joined without deteriorating the previously formed anodic oxide film during the joining. Therefore, the aforementioned excellent corrosion resisting effects can be maintained well, which enables to manufacture a cooling plate excellent in durability and long in life.

The terms and descriptions in this specification are used only for explanatory purposes and the present invention is not limited to these terms and descriptions and does not exclude features equivalent to the disclosed and described features. It should also be appreciated that the present invention permits any design-change which falls within the scope of the present invention defined by the appended claims.

What is claimed is:

1. A cooling plate provided with a cooling medium passage therein, said cooling plate comprising:

a plurality of metal plates having flat joining surfaces respectively, a cooling medium passage forming groove being formed on each of said flat joining surfaces, said plurality of metal plates being integrally joined by a friction agitation joining method to thereby form said cooling medium passage;

an anodic oxide film formed on said cooling medium passage forming groove; and a sealing agent disposed between said flat joining surfaces to fluid-tightly seal a gap formed between said flat joining surfaces along a periphery of said cooling medium passage.

2. The cooling plate as recited in claim 1, wherein said anodic oxide film is formed on an entire surface of each of said joining surfaces.

3. The cooling plate as recited in claim 1, wherein said sealing agent is metal material.

4. The cooling plate as recited in claim 1, wherein said sealing agent is waterproof resin adhesive.

5. The cooling plate as recited in claim 4, wherein said waterproof resin adhesive is one or more resins selected from a group consisting of epoxy family resin, phenol family resin and polyolefin family resin.

6. The cooling plate as recited in claim 1, wherein said plurality of metal plates are aluminum plates.

7. A cooling plate provided with a cooling medium passage therein, said cooling plate comprising:

a plurality of metal plates having flat joining surfaces respectively, a cooling medium passage forming groove being formed on each of said flat joining surfaces, said plurality of metal plates being integrally joined by a friction agitation joining method to thereby form said cooling medium passage;

an anodic oxide film formed on said cooling medium passage forming groove and an entire surface of each of said flat joining surfaces; and a sealing agent disposed between said flat joining surfaces to fluid-tightly seal a gap formed between said flat joining surfaces along a periphery of said cooling medium passage, wherein each of said plurality of metal plates is an aluminum plate.

8. The cooling plate as recited in claim 7, wherein said sealing agent is metal material.

9. The cooling plate as recited in claim 7, wherein said sealing agent is waterproof resin adhesive.

10. The cooling plate as recited in claim 9, wherein said waterproof resin adhesive is one or more resins selected from a group consisting of epoxy family resin, phenol family resin and polyolefin family resin.

* * * * *

UNITED STATES PATENT AND TRADEMARK OFFICE
CERTIFICATE OF CORRECTION

PATENT NO. : 6,686,052 B2
DATED : February 3, 2004
INVENTOR(S) : Jogan et al.

It is certified that error appears in the above-identified patent and that said Letters Patent is hereby corrected as shown below:

<u>Title page</u>,
Item [30], Foreign Application Priority Data, should read:
-- [30]          Foreign Application Priority Data
      Jun. 20, 2001    (JP) ………………………….. 2001-185859 --

Signed and Sealed this

Thirtieth Day of March, 2004

JON W. DUDAS
*Acting Director of the United States Patent and Trademark Office*